US008859715B2

(12) United States Patent
Leu et al.

(10) Patent No.: US 8,859,715 B2
(45) Date of Patent: Oct. 14, 2014

(54) POLYIMIDE POLYMER SOLUTION, POLYIMIDE POLYMER, TRANSPARENT FILM, DISPLAYING DEVICE AND SOLAR CELL

(75) Inventors: Chyi-Ming Leu, Zhudong Township, Hsinchu County (TW); Chih-Cheng Lin, Hsinchu (TW); Chi-Fu Tseng, Taipei (TW); Hsueh-Yi Liao, New Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 103 days.

(21) Appl. No.: 13/334,883

(22) Filed: Dec. 22, 2011

(65) Prior Publication Data

US 2012/0160317 A1   Jun. 28, 2012

(30) Foreign Application Priority Data

Dec. 23, 2010 (TW) ............................... 99145602 A
Aug. 25, 2011 (TW) ............................. 100130564 A (51) Int. Cl.
*C08G 73/10* (2006.01)
*H01L 31/0216* (2014.01)
*H01L 31/0392* (2006.01)
*C08L 79/08* (2006.01)

(52) U.S. Cl.
CPC ...... *C08G 73/1042* (2013.01); *H01L 31/02168* (2013.01); *C08G 73/1075* (2013.01); *H01L 31/03926* (2013.01); *C08G 73/1046* (2013.01); *Y02E 10/50* (2013.01); *C08L 79/08* (2013.01)
USPC .......... 528/353; 428/1.26; 428/395; 525/205; 528/310

(58) Field of Classification Search
USPC ........... 428/1.26, 395; 525/205; 528/310, 323
See application file for complete search history.

(56) References Cited

U.S. PATENT DOCUMENTS

| | | | |
|---|---|---|---|
| 1,945,396 A | 1/1934 | Gerling | |
| 5,026,823 A | 6/1991 | Summers et al. | |
| 5,985,969 A * | 11/1999 | Harris et al. ................. | 524/233 |
| 6,710,160 B2 | 3/2004 | Yamashita et al. | |
| 7,504,138 B2 | 3/2009 | Leu et al. | |
| 7,651,744 B2 | 1/2010 | Tyan et al. | |
| 7,662,449 B2 | 2/2010 | Tyan et al. | |
| 7,727,600 B2 | 6/2010 | Leu et al. | |
| 8,404,319 B2 | 3/2013 | Lin et al. | |
| 2008/0113120 A1 | 5/2008 | Tyan et al. | |
| 2008/0286498 A1 | 11/2008 | Lin et al. | |
| 2009/0137770 A1 * | 5/2009 | Leu et al. ..................... | 528/353 |
| 2010/0048861 A1 | 2/2010 | Jung et al. | |

FOREIGN PATENT DOCUMENTS

CN       1945396      4/2007
(Continued)

OTHER PUBLICATIONS

English language translation of abstract of TW 200712618 (published Apr. 1, 2007).
English language translation of abstract of CN 1945396 (published Apr. 11, 2007).
English language translation of abstract of TW 200717097 (published May 1, 2007).
Bas, C., et al.; "Microstructural Parameters Controlling Gas Permeability and Permselectivity in Polymide Membranes;" Journal of Membrane Science 349; 2010; pp. 25-34.
(Continued)

*Primary Examiner* — Gregory Listvoyb
(74) *Attorney, Agent, or Firm* — McClure, Qualey & Rodack, LLP

(57) ABSTRACT

A polyimide polymer solution, a polyimide polymer, a transparent film, a display device and a solar cell are provided. The polyimide polymer has at least one of a repeating unit of formula (D) and a repeating unit of formula (J) and at least one of a repeating unit of formula (Q) and a repeating unit of formula (T).

formula (D)

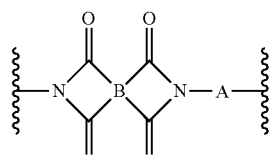

formula (J)

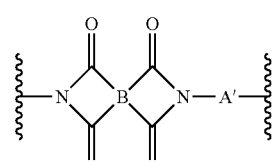

formula (Q)

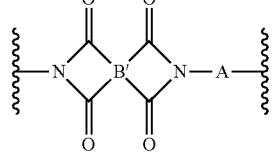

formula (T)

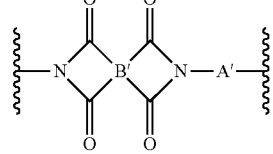

One of B and B' is cyclo-aliphatic compound, and the other is aromatic compound, a molar mass ratio of the cyclo-aliphatic compound to the aromatic compound is 1~4, A and A' are identical or different aromatic diamines, and at least one of A and A' is aromatic diamine with ether groups, and A could be the same as or different from A'.

9 Claims, 2 Drawing Sheets

(56) References Cited

FOREIGN PATENT DOCUMENTS

| | | |
|---|---|---|
| JP | 1180519 A | 7/1989 |
| JP | 6222367 A | 8/1994 |
| TW | 200712618 | 4/2007 |
| TW | 200717097 | 5/2007 |
| TW | 200844471 A | 11/2008 |
| WO | WO 2008/072915 | 6/2008 |
| WO | WO 2008/072916 | 6/2008 |

OTHER PUBLICATIONS

Chun, B.W.; "Preparation and Characterization of Organic-Soluble Optically Transparent Polyimides from Alicyclic Dianhydride, Bicyclo [2.2.2]-oct-7-ene-2, 3, 4, 5, 6-tetracarboxylic Dianhydride;" Polymer; vol. 35; No. 19; 1994; pp. 4203-4208.
TW Office Action dated Apr. 10, 2014.
English Abstract translation of JP1180519 (Published Jul. 18, 1989).
English Abstract translation of JP06222367 (Published Aug. 12, 1994).

* cited by examiner

POLYIMIDE POLYMER SOLUTION, POLYIMIDE POLYMER, TRANSPARENT FILM, DISPLAYING DEVICE AND SOLAR CELL

This application claims the benefit of Taiwan application Serial No. 99145602, filed Dec. 23, 2010, and Taiwan application Serial No. 100130564, filed Aug. 25, 2011, the disclosure of which is incorporated by reference herein in its entirety.

BACKGROUND

1. Technical Field

The disclosure relates in general to a polymer, and more particularly to a polyimide polymer solution, a polyimide polymer, a transparent film, a displaying device and a solar cell.

2. Description of the Related Art

Recently, applications of flexible display have attracted worldwide interest. The flexible display technology has become more and more mature under the thriving researches and developments. Also, the major focus of technology has changed from the passive flexible display to the active flexible display. Because of light weight, easy to carry, not easy to fragile, good impact resistance, good flexibility and wearability, the flexible display has become one of the new trends of the next-generation displays. The development of flexible display is directly related to the material of the substrate, and different displaying mediums require different materials of the substrates. Thus, it is very important to develop the substrate with characteristics of thermal duration, sustainability under the TFT procedures, also good UV cut and colorless under UV irradiation, thereby prolonging the life time of the display by blocking the UV light.

Conventional polyimide plastic substrate has good properties of thermo-duration, being able to directly coat on the glass, being sustainable at the procedure with temperature over 200° C., as well as good dimensional reliability. However, the polyimide plastic substrate is yellowed color, and it is difficult to make this colorless.

Therefore, it is an important trend to develop a novel flexible plastic thin film material with improved thermo-durability (300° C.), dimensional reliability, anti-corrosive to chemicals and good UV resistance, through chemical modification or special processing on the flexible and transparent plastic thin film material with high glass transition temperature (Tg).

SUMMARY

The present disclosure provides a polyimide polymer solution, a polyimide polymer, a transparent film, a displaying device and a solar cell. Moreover, an UV absorbent could be further added in the preparation, for improving the anti-UV property. According to one embodiment of the present disclosure, the polyimide polymer solution is provided. The polyimide polymer solution comprises a solvent and a polyimide polymer. The polyimide polymer has at least one of a repeating unit of formula (D) and a repeating unit of formula (J) and at least one of a repeating unit of formula (Q) and a repeating unit of formula (T).

formula (D)

formula (J)

formula (Q)

formula (T)

One of B and B' is cyclo-aliphatic compound, the other one of B and B' is aromatic compound. A molar mass ratio of the cyclo-aliphatic compound to the aromatic compound is 1~4.

A and A' are identical or different aromatic diamine monomers. At least one of A and A' is an aromatic diamine monomer with an ether group.

The cyclo-aliphatic compound of B or B' comprises:

The aromatic compound of B or B' comprises:

A and A' are individually selected from:

,

,

,

,

,

, or

.

According to one embodiment of the present disclosure, a polyimide polymer is provided. The polyimide polymer has at least one of a repeating unit of formula (D) and a repeating unit of formula (J) and at least one of a repeating unit of formula (Q) and a repeating unit of formula (T).

formula (D)

formula (J)

formula (Q)

formula (T)

One of B and B' is cyclo-aliphatic compound, the other one of B and B' is aromatic compound. A molar mass ratio of the cyclo-aliphatic compound to the aromatic compound is 1~4.

A and A' are identical or different aromatic diamine monomers. At least one of A and A' is an aromatic diamine monomer with an ether group.

The cyclo-aliphatic compound of B or B' comprises:

The aromatic compound of B or B' comprises:

, or

.

A and A' are individually selected from:

According to one embodiment of the present disclosure, a transparent film is provided. The transparent film is made of a polyimide polymer. The polyimide polymer has at least one of a repeating unit of formula (D) and a repeating unit of formula (J) and at least one of a repeating unit of formula (Q) and a repeating unit of formula (T).

formula (D)

formula (J)

formula (Q)

formula (T)

One of B and B' is cyclo-aliphatic compound, the other one of B and B' is aromatic compound. A molar mass ratio of the cyclo-aliphatic compound to the aromatic compound is 1~4.

A and A' are identical or different aromatic diamine monomers. At least one of A and A' is an aromatic diamine monomer with an ether group.

The cyclo-aliphatic compound of B or B' comprises:

The cyclo-aliphatic compound of B or B' comprises:

A and A' are individually selected from:

According to one embodiment of the present disclosure, a displaying device is provided. The displaying device comprises a first substrate and a second substrate disposed oppositely. One of the first and second substrates is made of a polyimide polymer. The polyimide polymer has at least one of a repeating unit of formula (D) and a repeating unit of formula (J) and at least one of a repeating unit of formula (Q) and a repeating unit of formula (T).

One of B and B' is cyclo-aliphatic compound, the other one of B and B' is aromatic compound. A molar mass ratio of the cyclo-aliphatic compound to the aromatic compound is 1~4.

A and A' are identical or different aromatic diamine monomers. At least one of A and A' is an aromatic diamine monomer with an ether group.

The cyclo-aliphatic compound of B or B' comprises:

The aromatic compound of B or B' comprises:

A and A' are individually selected from:

-continued

According to one embodiment of the present disclosure, a solar cell is provided. The solar cell comprises a first film, a first electrode, an element layer and a second electrode. The first electrode is on the first film. The element layer is between the first electrode and the second electrode. The polyimide polymer has at least one of a repeating unit of formula (D) and a repeating unit of formula (J) and at least one of a repeating unit of formula (Q) and a repeating unit of formula (T).

One of B and B' is cyclo-aliphatic compound, the other one of B and B' is aromatic compound. A molar mass ratio of the cyclo-aliphatic compound to the aromatic compound is 1~4.

A and A' are identical or different aromatic diamine monomers. At least one of A and A' is an aromatic diamine monomer with an ether group.

The cyclo-aliphatic compound of B or B' comprises:

The aromatic compound of B or B' comprises:

A and A' are individually selected from:

-continued or

The disclosure will become apparent from the following detailed description of the non-limiting embodiments. The following description is made with reference to the accompanying drawings.

DETAILED DESCRIPTION

A method for manufacturing a polyimide polymer comprises mixing a solvent, a cyclo-aliphatic dianhydride, an aromatic dianhydride, and one or more kinds of aromatic diamines. The mixture is polymerized by using a high temperature process to obtain a polyimide polymer solution. At least one kind of the aromatic diamine of the polyimide polymer solution is an aromatic diamine with an ether group. The molar ratio of the cyclo-aliphatic dianhydride to the aromatic dianhydride is 1~4.

For example, the cyclo-aliphatic dianhydride comprises:

(bicyclo[2,2,2]oct-7-ene-2,3,5,6-tetracarboxylic dianhydride), (bicyclo[2.2.2]octane-2,3,5,6-tetracarboxylic2,3:5,6-dianhydride), or (bicyclo[2.2.1]heptane-2,3,5,6-tetracarboxylic2,3:5,6-dianhydride).

For example, the aromatic dianhydride comprises:

(4,4'-oxydiphthalic anhydride), or (4,4'-(Hexafluoroisopropylidene)Diphthalic anhydride).

For example, the aromatic diamine comprises:

(4,4-diaminodiphenyl ether),

(3,4-Diaminodiphenyl ether),

(2,2-Bis[4-(4-aminophenoxy)phenyl]propane),

(2,2-Bis[4-(4-aminophenoxy)phenyl]hexafluoropropane),

(4,4'-Bis(3-amino phenoxy)diphenyl sulfone),

(4,4-bis(4-aminophenoxy)biphenyl),

(1,3-bis(4-aminophenoxy)benzene), (1,3-bis(3-aminophenoxy)benzene);

(2,2'-dimethyl-4,4'-diaminobiphenyl)

or (2,2'-bis(triflroromethyl)benzidine).

For example, the solvent comprises a phenol solvent, a cyclic ketone solvent, a carboxamide solvent, or a combination thereof. For example, the phenol solvent comprises m-cresol, Cl-phenol. For example, the cyclic ketone solvent cyclopentanone, γ-butylactone or N-methylpyrrolidinone (NMP). For example, the carboxamide solvent comprises N,N-dimethylacetamide (DMAC).

The polyimide polymer in the polyimide polymer solution comprises at least one of a repeating unit of formula (D) and a repeating unit of formula (J) and at least one of a repeating unit of formula (Q) and a repeating unit of formula (T).

formula (D)

formula (J)

formula (Q)

formula (T)

One of B and B' is cyclo-aliphatic compound, the other one of B and B' is aromatic compound. A molar mass ratio of the cyclo-aliphatic compound to the aromatic compound is 1~4.

A and A' are identical or different aromatic diamine monomers. At least one of A and A' is an aromatic diamine monomer with an ether group.

In embodiments, for example, the cyclo-aliphatic compound of B or B' comprises:

, or

In embodiments, for example, the aromatic compound of B or B' comprises:

In embodiments, A and A' are individually selected from:

A solid content of the polyimide polymer solution is 5~35% or 5~20%. A viscosity of the polyimide polymer solution is 1 cp~50000 cp, 100 cp~20000 cp, 1000 cp~15000 cp, or 2000 cp~10000 cp.

Moreover, an UV absorbent could be further added into the polyimide polymer solution. Examples of the UV absorbent include a benzotriazole compound, a benzophenone compound, and the likes. In an embodiment, an addition amount of the UV absorbent is in a range of about 0.5-5 wt %.

The polyimide polymer solution may be coated onto a substrate and then dried to form a film. The film is transparent and can be used as an UV resistant film and used for an application of the UV resistant film. In embodiments, the film has an ultraviolet radiation transmittance of at least 50% (50% cut off) for a wavelength of 395 nm~410 nm. In addition, the film has high transmittance, properties of colorless, good thermo-duration at high temperature (Tg>300☐), good flexibility, anti-corrosive to the chemicals (ex: photo-resist, oxalic acid, developer, and stripper), good UV resistance, and anti-yellow under UV-radiation. Moreover, an UV absorbent could be further added in the polyimide polymer solution, for improving the anti-UV property. By blocking the UV irradiation, the degradation of the products applied with this UV resistant film would be slowed, so as to prolong the life time of the products.

The film made of the polyimide polymer in embodiments could be widely used in any products (ex: flexible electronics) requiring block of UV irradiation. For example, the UV resistant film could be applied to the flexible displayers, the solar cells and the sun glasses, for being a soft, transparent and colorless UV resistant film. The UV resistant film could be also applied to windows of the cars or roofs of the houses, as a heat insulation paper.

The film made of the polyimide can be applied for flexible electronics, comprising particle displayers, liquid crystal displays (LCD) and micro-electro-mechanical systems (MEMS). The applicable types of particle displayers are such as electrochromic displays (ECD) or electro-phoretic displays (EPD). The applicable types of LCDs are such as cholesteric LCD (Ch-LCD) or bistable twisted-nematic (TN) LCD.

A displaying device is further provided for application description. An UV resistant film made of the polyimide polymer according to the aforementioned embodiment could be applied to a displaying device. The displaying device comprises a first substrate, a second substrate disposed opposite to the first substrate, and a dielectric layer disposed between the first and second substrates. At least one of the first and second substrates has the film made of the polyimide polymer.

In an embodiment, the dielectric layer may comprise liquid crystal molecules, microcapsules electrophoretics or polymers, such as nematic liquid crystals, smectic liquid crystals, cholesteric liquid crystals, microcapsules of E-ink, fluorescent molecules or fluorescent polymers.

Figure 1:
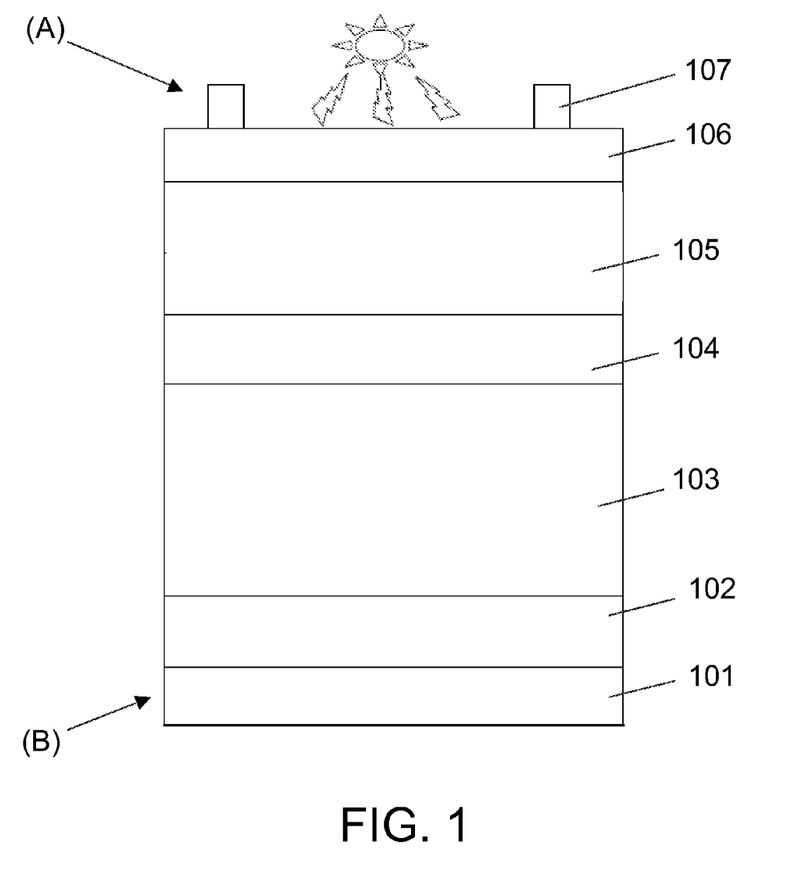
FIG. 1 is a cross-sectional view of a copper indium gallium diselenide (CIGS) solar cell.

Besides the applications mentioned above, the film made of the polyimide polymer accordingly could also be applied to the solar cells. There are many different types of the thin film solar cells being developed, such as amorphous silicon (a-Si) solar cells, cadmium telluride (CdTe) thin film photovoltaics, copper indium gallium diselenide (CIGS) solar cells, and multijuction cells. A CIGS solar cell, which has high photoelectric conversion efficiency and low cost of materials, is taken for illustration. FIG. 1 is a cross-sectional view of a copper indium gallium diselenide (CIGS) solar cell. As shown in FIG. 1, the CIGS solar cell includes a first electrode (internal electrode layer or back contact) 102 formed on a substrate 101 by sputtering. Typically, the substrate 101 is made of glass, metal sheet or polymer, and the internal electrode layer 102 is made of molybdenum (Mo). An absorbing layer 103, made of $CuIn_{1-x}Ga_xSe_2$, is formed on the internal electrode layer 102 by vacuum or non-vacuum methods. A buffer layer 104 is then formed on the absorbing layer 103, generally by depositing CdS using chemical bath deposition. A transparent window layer 105 is then formed on the buffer layer 104, and the material of the transparent window layer 105 could be zinc oxide (ZnO) or indium tin oxide (ITO). An antireflection layer 106, generally made of MgF2, is then formed on the transparent window layer 105. An exterior electrode (as a front contact) 107 is formed on the top of the antireflection layer 106, by Ni/Al evaporation. The element layer may be made of various films between a first electrode 102 and a second electrode 107, such as the absorbing layer 103, the buffer layer 104, the transparent window layer 105 and the antireflection layer 106.

As shown in FIG. 1, the thickness of the first electrode 102 could be about 0.5~1.5 μm, the thickness of the absorbing layer 103 could be about 1.5~2.0 μm, the thickness of the buffer layer 104 could be about 0.03~0.0.5 μm, the thickness of the transparent window layer 105 could be about 0.5~1.5 μm, and the thickness of the antireflection layer 106 could be about 0.1 μm.

The film made of the polyimide polymer of the embodiment could be applied to the solar cell as shown in FIG. 1. The UV resistant film could (1) be positioned on the top of the solar cell, such as on the antireflection layer 106 as an outer (exterior) layer, for being a protective film of the solar cell (for blocking UV radiation); or (2) function as a substrate for replacing the substrate 101 of FIG. 1.

<Polyimide Polymer, Synthesis Thereof, and Relative Experiments>

Syntheses of polyimide involve typical poly-condensation reaction, using one-step procedure and two-step procedure. In the two-step procedure, monomers of diamine and dianhydride are added into a polar solvent (under nitrogen gas or inert gas) to form a precursor of polyimide—poly(amic acid) (PAA). Polyamic acid (PAA) is then imidizated by thermal or chemical methods, thereby conducting cyclodehydration (imidization) of PAA to form polyimide. In the one-step procedure, monomers of diamine and dianhydride are added into a solution at reflux temperature to form polyimide.

Two-Step Procedure

One-Step Procedure

Six examples and two comparisons are disclosed below for illustrating the syntheses of polyimide. After preparation of polyimide, the related experiments such as transmittance and UV-resistance are also conducted herein for investigation.

Example 1

Syntheses of ODPA(0.3)-B1317(0.7)-ODA(0.7)-BAPPm(0.3)

0.0118 mole of BAPPm and 0.0275 mole of ODA (aromatic diamines) are added into a solvent of 119.23 g of m-cresol in a three-necked bottle under nitrogen gas at room temperature. After BAPPm and ODA completely dissolved, 0.0120 mole of ODPA and 0.0281 mole of B1317 (dianhydride) are added into the solution. After B1317 completely dissolved, the solution is stirred for about 1 hour, and a sticky solution of polyamic acid is formed, and heated to about 220° C. The heating temperature is maintained for about 3 hours, and water is also removed by the suitable apparatus during the reaction. After the mixture is cooled to room temperature, it is slowly added into methanol, and polyimide precipitated as threads. The precipitated polyimide is collected by filtration, and dried in a vacuum oven for about 12 hours. The dried polyimide precipitate is added into dimethylacetamide (DMAc), and the solid content of the solution is about 15%, has a viscosity of 2000 cp~6000 cp. The solution is coated on the glass and dried to form a thin film of polyimide.

4,4-bis(aminophenoxy)propane (BAPPm)→

Oxydianiline (ODA)→

4,4'-Oxydi(phthalic anhydride) (ODPA)→

Bicyclo[2,2,2]oct-7-ene-2,3,5,6-tetracarboxylic dianhydride (B1317)→

Example 2

Composition of ODPA(0.3)-B1317(0.7)-ODA(0.7)-BAPPm(0.3) and Benzophenone Compound Benzophenone compound (UV absorbent) is dissolved in ethyl acetate, and the solid content of the solution is about 10%. The polyimide solution prepared in Example 1 is then added into the solution, and benzophenone and polyimide in the mixture is about 2 wt %. The mixture is coated on the glass and dried to form a thin film of polyimide/benzophenone.

Example 3

Syntheses of 6FPA(0.3)-B1317(0.7)-ODA(0.7)-BAPPm(0.3)

0.0118 mole of BAPPm and 0.0275 mole of ODA (aromatic diamines) are added into a solvent of 128.38 g of m-cresol in a three-necked bottle under nitrogen gas at room temperature. After BAPPm and ODA completely dissolved, 0.0120 mole of 6FDA and 0.0281 mole of B1317 (dianhydride) are added into the solution. After B1317 completely dissolved, the solution is stirred for about 1 hour, and a sticky solution of polyamic acid is formed, and heated to about 220° C. The heating temperature is maintained for about 3 hours, and water is also removed by the suitable apparatus during the reaction. After the mixture is cooled to room temperature, it is slowly added into methanol, and polyimide precipitated as threads. The precipitated polyimide is collected by filtration, and dried in a vacuum oven for about 12 hours. The dried polyimide precipitate is added into dimethylacetamide (DMAc), and the solid content of the solution is about 15%, has a viscosity of 2000 cp~6000 cp. The solution is coated on the glass and dried to form a thin film of polyimide.

BAPPm, ODA, and B1317 are presented in Example 1.

2,2'-Bis-(3,4-Dicarboxyphenyl)hexafluoropropane dianhydride (6FDA)→

Example 4

Composition of 6FPA(0.3)-B1317(0.7)-ODA(0.7)-BAPPm(0.3) and Benzophenone Compound Benzophenone compound (UV absorbent) is dissolved in ethyl acetate, and the solid content of the solution is about 10%. The polyimide solution prepared in Example 3 is then added into the solution, and benzophenone and polyimide in the mixture is about 2 wt %. The mixture is coated on the glass and dried to form a thin film of polyimide/benzophenone.

Example 5

Syntheses of ODPA(0.2)-B1317(0.8)-ODA(0.7)-BAPPm(0.3)

0.0118 mole of BAPPm and 0.0275 mole of ODA (aromatic diamines) are added into a solvent of 117.30 g of m-cresol in a three-necked bottle under nitrogen gas at room temperature. After BAPPm and ODA completely dissolved, 0.00803 mole of ODPA and 0.0321 mole of B1317 (dianhydride) are added into the solution. After B1317 completely dissolved, the solution is stirred for about 1 hour, and a sticky solution of polyamic acid is formed, and heated to about 220° C. The heating temperature is maintained for about 3 hours, and water is also removed by the suitable apparatus during the reaction. After the mixture is cooled to room temperature, it is slowly added into methanol, and polyimide precipitated as threads. The precipitated polyimide is collected by filtration, and dried in a vacuum oven for about 12 hours. The dried polyimide precipitate is added into dimethylacetamide (DMAc), and the solid content of the solution is about 15%, has a viscosity of 2000 cp~6000 cp. The solution is coated on the glass and dried to form a thin film of polyimide.

Example 6

Syntheses of ODPA(0.5)-B1317(0.5)-ODA(0.7)-BAPPm(0.3)

0.0118 mole of BAPPm and 0.0275 mole of ODA (aromatic diamines) are added into a solvent of 121.94 g of m-cresol in a three-necked bottle under nitrogen gas at room temperature. After BAPPm and ODA completely dissolved, 0.0200 mole of ODPA and 0.0200 mole of B1317 (dianhydride) are added into the solution. After B1317 dissolved, the solution is stirred for about 1 hour, and a sticky solution of polyamic acid is formed, and heated to about 220° C. The heating temperature is maintained for about 3 hours, and water is also removed by the suitable apparatus during the reaction. After the mixture is cooled to room temperature, it is slowly added into methanol, and polyimide precipitated as threads. The precipitated polyimide is collected by filtration, and dried in a vacuum oven for about 12 hours. The dried polyimide precipitate is added into dimethylacetamide (DMAc), and the solid content of the solution is about 15%, has a viscosity of 2000 cp~6000 cp. The solution is coated on the glass and dried to form a thin film of polyimide.

Comparison 1—Syntheses of B1317-BAPB(0.7)-BAPPm(0.3)

0.0118 mole of BAPPm and 0.0275 mole of BAPB (diamines) are added into a solvent of 141.14 g of m-cresol in a three-necked bottle under nitrogen gas at room temperature. After BAPPm and BAPB completely dissolved, 0.04 mole of B1317 (dianhydride) are added into the solution. After B1317 completely dissolved, the solution is stirred for about 1 hour, and a sticky solution of polyamic acid is formed, and heated to about 220° C. The heating temperature is maintained for about 3 hours, and water is also removed by the suitable apparatus during the reaction. After the mixture is cooled to room temperature, it is slowly added into methanol, and polyimide precipitated as threads. The precipitated polyimide is collected by filtration, and dried in a vacuum oven for about 12 hours. The dried polyimide precipitate is added into dimethylacetamide (DMAc), and the solid content of the solution is about 15%. The solution is coated on the glass and dried to form a thin film of polyimide.

BAPPm and 81317 are presented in Example 1.

1,4-bis(4-aminophenoxy)benzene (BAPB)→

Comparison 2—Composition of B1317-BAPB(0.7)-BAPPm (0.3) and Benzophenone Compound Benzophenone compound (UV absorbent) is dissolved in ethyl acetate, and the solid content of the solution is about 10%. The polyimide solution prepared in Comparison 1 is then added into the solution, and benzophenone and polyimide in the mixture is about 2 wt %. The mixture is coated on the glass and dried to form a thin film of polyimide/benzophenone.

Figure 2:
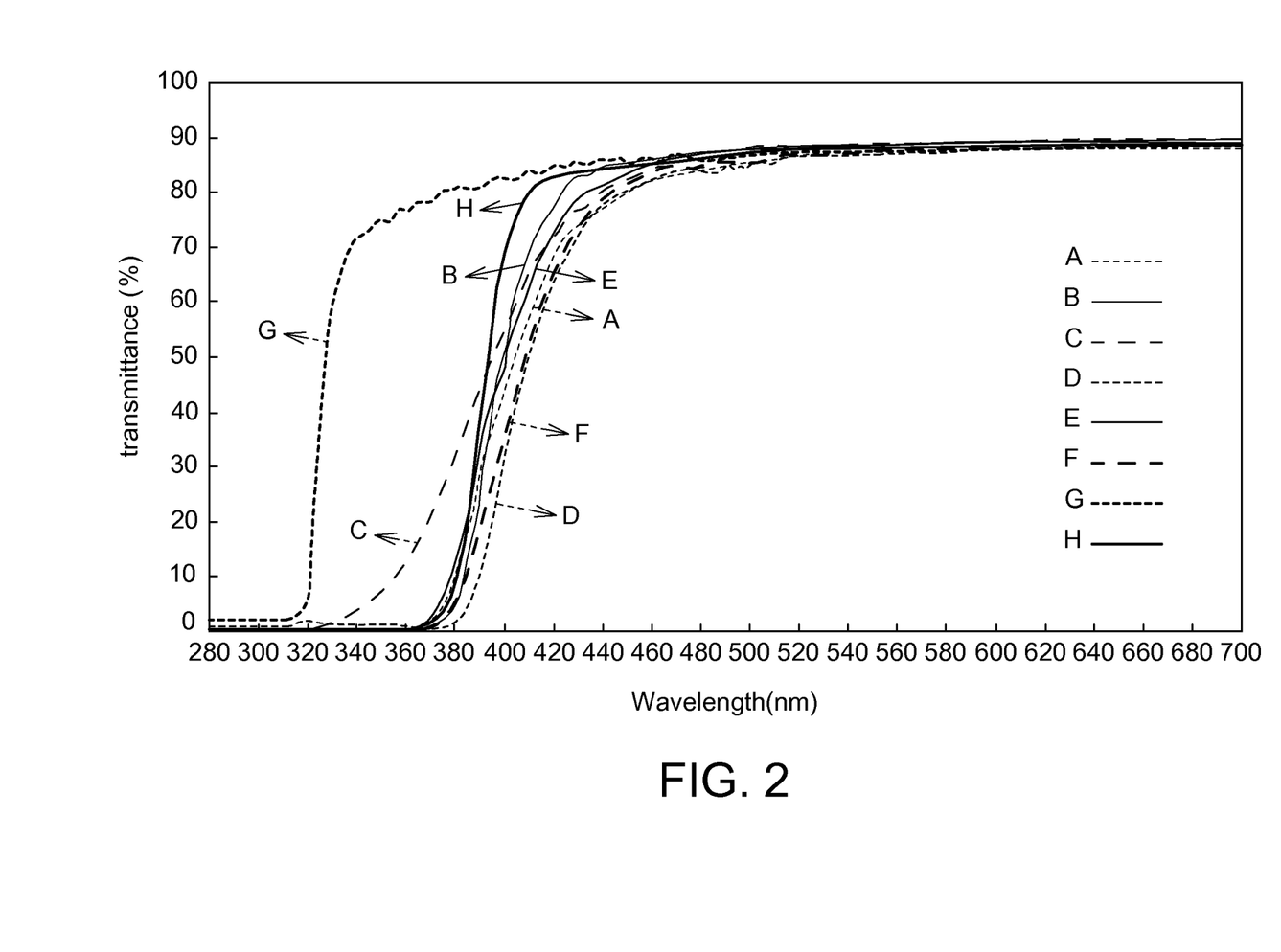
FIG. 2 shows the ultraviolet-visible (UV-VIS) spectrum of the coating thin films manufactured according to Examples 1~6 and Comparisons 1~2.

Table 1 lists compositions of Examples 1~6 and Comparisons 1~2. Also, the related experiments such as transmittances and UV-resistances of the thin films manufactured in Examples 1~6 and Comparisons 1~2 are conducted. In the transmittance experiments, Perkin Elemer Lambda 900 Spectrometer is used to obtain the UV-Visible spectrum of the coating thin films. FIG. 2 shows the ultraviolet-visible (UV-VIS) spectrum of the coating thin films manufactured according to Examples 1~6 and Comparisons 1~2. In FIG. 2, x-axis represents wavelength of light source used for testing the samples, and y-axis represents transmittance of the light passing through the samples. Curves A, B, C, D, E and F indicate the results of the coating thin films manufactured according to Examples 1~6 respectively, while curves G and H indicate the results of the coating thin films manufactured according to Comparisons 1~2 respectively. The wavelengths at 50% of the ultraviolet radiation transmittance (50% cut off) of the coating thin films manufactured according to Examples 1~6 and Comparisons 1~2 are respectively 405 nm, 400 nm, 396 nm, 409 nm, 401 nm, 408 nm, 328 nm, and 394 nm which are indicated from FIG. 2 (also listed in Table 1).

As shown in FIG. 2 and Table 1, the results have indicated that the coating thin films manufactured according to Examples 1~6 have better UV blocking effect (UV cut) than Comparisons 1~2. The coating thin films of Comparisons 1~2 are manufactured by cyclo-aliphatic dianhydride, while the coating thin films of Examples 1~6 are manufactured by cyclo-aliphatic dianhydride and aromatic dianhydride. Addition of aromatic dianhydride increases the polymer absorbability of UV light. Moreover, the coating thin films of Examples 1~6 (ex: Example 1 verse Example 2, or Example 3 verse Example 4) have good UV blocking effect, with or without addition of benzophenone compound (UV absorbent).

TABLE 1

| | Compositions | | | | |
|---|---|---|---|---|---|
| | Dianhydride | | Diamine | | benzophenone compound, wt % | 50% Cut-off (nm) |
| Example 1 | B1317 (0.7) | ODPA (0.3) | ODA (0.7) | BAPPm (0.3) | 0 | 405 |
| Example 2 | B1317 (0.7) | ODPA (0.3) | ODA (0.7) | BAPPm (0.3) | 2 | 400 |
| Example 3 | B1317 (0.7) | 6FDA (0.3) | ODA (0.7) | BAPPm (0.3) | 0 | 396 |
| Example 4 | B1317 (0.7) | 6FDA (0.3) | ODA (0.7) | BAPPm (0.3) | 2 | 409 |
| Example 5 | B1317 (0.8) | ODPA (0.2) | ODA (0.7) | BAPPm (0.3) | 0 | 401 |
| Example 6 | B1317 (0.5) | ODPA (0.5) | ODA (0.7) | BAPPm (0.3) | 0 | 408 |
| Comparison 1 | B1317 | | BAPB (0.7) | BAPPm (0.3) | 0 | 328 |
| Comparison 2 | B1317 | | BAPB (0.7) | BAPPm (0.3) | 2 | 394 |

Also, the related experiment of UV-resistances (i.e. aging speeding experiment) of the thin films manufactured in Examples 1~6 and Comparisons 1~2 are conducted, and the results are listed in Table 2. In the UV-resistances experiments, an UV-aging QUV machine (Lamp: UVA-351, wavelength of 320~400 nm, 0.45 W/m² at wavelength of 340 nm, simulating the effects of the sun passing through the glass, and closer to the results of outdoor measurement) is used to irradiate the samples with UV light continuously. After continuous irradiation of 100 hours, 200 hours, 400 hours, 500 hours and 1000 hours, yellow index of each of the thin film samples are measured, and listed in Table 2.

Also, the thicknesses of the thin film samples manufactured in Examples 1~6 and Comparisons 1~2 are 41 μm, 40 μm, 33 μm, 26 μm, 35 μm, 35 μm, 38 μm and 35 μm, respectively. The thickness of the thin films can be adjusted according to the applications.

TABLE 2

| | Thickness (μm) | 0 hour | 100 hours | 200 hours | 400 hours | 500 hours | 1000 hours |
|---|---|---|---|---|---|---|---|
| Comparison 1 | 41 | 1.54 | 8.16 | 13.63 | — | — | — |
| Comparison 2 | 40 | 2.66 | 4.75 | 6.17 | 8.16 | 9.63 | — |
| Example 1 | 33 | 3.33 | 4.55 | 5.64 | 6.44 | 7.65 | 9.51 |
| Example 2 | 26 | 2.98 | 4.5 | 4.7 | 5.7 | 6.1 | 7.89 |
| Example 3 | 35 | 5.52 | 6.63 | 7.09 | 7.88 | 8.35 | 9.08 |
| Example 4 | 35 | 5.71 | 6.53 | 6.71 | 6.88 | 7.04 | 8.03 |
| Example 5 | 38 | 3.18 | 4.39 | 5.3 | 6.1 | 7.45 | |
| Example 6 | 35 | 4.45 | 5.1 | 5.63 | 6.22 | 6.98 | |

As shown in Table 2, the results have indicated that the coating thin films manufactured according to Comparisons 1~2 have higher yellow index than Examples 1~6 under the same UV irradiation time. The higher yellow index signifies the incapability of UV-resistance. Accordingly, the coating thin films manufactured according to Examples 1~6 have good properties of UV-resistance and capability of maintaining color without turning yellow. Moreover, the results have indicated that the samples with addition of benzophenone compound (UV absorbent) have lower yellow index than the samples without benzophenone compound under the same UV irradiation time (ex: Example 1 verse Example 2, or Example 3 verse Example 4).

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:
1. A polyimide polymer solution, comprising:
a solvent; and
a polyimide polymer, wherein the polyimide polymer has at least one of a repeating unit of formula (D) and a repeating unit of formula (J) and at least one of a repeating unit of formula (Q) and a repeating unit of formula (T), formula (D)

formula (J)

formula (Q)

formula (T)

one of B and B' is cyclo-aliphatic compound, the other one of B and B' is aromatic compound, a molar ratio of the cyclo-aliphatic compound to the aromatic compound is 1~4, A and A' are identical or different aromatic diamine monomers, wherein at least one of A and A' is an aromatic diamine monomer with an ether group, the cyclo-aliphatic compound of B or B' comprises:

the aromatic compound of B or B' comprises:

A and A' are individually selected from:

2. The polyimide polymer solution according to claim 1, wherein the polyimide polymer solution has a viscosity of 1 cp~50000 cp.

3. The polyimide polymer solution according to claim 1, wherein the solvent comprises a phenol solvent, a cyclic ketone solvent, a carboxamide solvent, or a combination thereof.

4. A polyimide polymer, wherein the polyimide polymer has at least one of a repeating unit of formula (D) and a repeating unit of formula (J) and at least one of a repeating unit of formula (Q) and a repeating unit of formula (T), formula (D)

formula (J)

formula (Q)

formula (T)

one of B and B' is cyclo-aliphatic compound, the other one of B and B' is aromatic compound, a molar ratio of the cyclo-aliphatic compound to the aromatic compound is 1~4, A and A' are identical or different aromatic diamine monomers, wherein at least one of A and A' is an aromatic diamine monomer with an ether group, the cyclo-aliphatic compound of B or B' comprises:

the aromatic compound of B or B' comprises:

A and A' are individually selected from:

5. A transparent film, which is made of the polyimide polymer according to claim 4.

6. A displaying device, comprising:
a first substrate and a second substrate disposed oppositely, wherein one of the first and second substrates is made of the polyimide polymer according to claim 4.

7. The displaying device according to claim 6, wherein the first substrate or the second substrate made of the polyimide polymer is used as an UV resistant film having an ultraviolet radiation transmittance of at least 50% (50% cut off) for a wavelength of 395 nm~410 nm.

8. A solar cell, comprising:
a first film;
a first electrode on the first film;
an element layer; and
a second electrode, wherein the element layer is between the first electrode and the second electrode, the first film is made of the polyimide polymer according to claim 4.

9. The solar cell according to claim 8, wherein the element layer comprises a second film at the most outside of which, the second film is made of a polyimide polymer, the polyimide polymer has at least one of a repeating unit of formula (D) and a repeating unit of formula (J) and at least one of a repeating unit of formula (Q) and a repeating unit of formula (T), formula (D)

formula (J)

formula (Q)

-continued formula (T)

one of B and B' is cyclo-aliphatic compound, the other one of B and B' is aromatic compound, a molar ratio of the cyclo-aliphatic compound to the aromatic compound is 1~4, A and A' are identical or different aromatic diamine monomers, wherein at least one of A and A' is an aromatic diamine monomer with an ether group, the cyclo-aliphatic compound of B or B' comprises:

the aromatic compound of B or B' comprises:

A and A' are individually selected from:

, or the polyimide polymer of the first film and the polyimide polymer of second film are identical or different.

* * * * *